(12) United States Patent
Koh et al.

(10) Patent No.: US 6,249,898 B1
(45) Date of Patent: Jun. 19, 2001

(54) METHOD AND SYSTEM FOR RELIABILITY ANALYSIS OF CMOS VLSI CIRCUITS BASED ON STAGE PARTITIONING AND NODE ACTIVITIES

(75) Inventors: Han Young Koh, Fremont; Jeh-Fu Tuan, San Jose; Tak K. Young, Cupertino, all of CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/109,999

(22) Filed: Jun. 30, 1998

(51) Int. Cl.[7] .................................................. G06F 17/50
(52) U.S. Cl. ...................................... 716/4; 716/5
(58) Field of Search ................................ 716/4, 5

(56) References Cited

U.S. PATENT DOCUMENTS

| | | | |
|---|---|---|---|
| 4,870,575 | 9/1989 | Rutenberg | 716/4 |
| 5,696,694 | 12/1997 | Khouja et al. | 716/4 |
| 5,822,218 | 10/1998 | Moosa et al. | 716/4 |

*Primary Examiner*—Trong Phan
(74) *Attorney, Agent, or Firm*—Wagner, Murabito & Hao LLP

(57) ABSTRACT

A unique, efficient method and system for reliability simulation of a semiconductor chip design comprising millions of transistors. Specifically, the instant method starts by storing device information about a chip design as inputted. Next, by first partitioning the complex circuit of the design into numerous smaller stages, each of which confines direct current flow within its boundary, then estimating the current consumption and the relative current contribution of each transistor for each stage, the method of the present invention determines the individual currents of all power network transistors with sufficient accuracy for reliability simulation. The instant method then uses the individual transistor currents and the stored device information, including data of an accurate resistor-capacitor model of the power network, to determine the branch currents and node voltages in all interconnect wires of the power network. Finally, the instant method reports all potential problems of the design identified based on the values of the branch currents and node voltages. As such, the present invention enables circuit designers to pinpoint where voltage drop and electromigration may pose problems and take appropriate corrective actions before chips are fabricated and sold. Thus, the present invention provides a novel and superior method for reliability simulation over the prior art by offering much greater simulation speed and capacity over conventional reliability simulation tools while delivering highly accurate results for reliability analysis crucial to today's deep submicron CMOS designs.

39 Claims, 8 Drawing Sheets

METHOD AND SYSTEM FOR RELIABILITY ANALYSIS OF CMOS VLSI CIRCUITS BASED ON STAGE PARTITIONING AND NODE ACTIVITIES

BACKGROUND OF THE INVENTION

1. Field of the Invention

The present invention relates to a power network simulation and analysis tool for testing the reliability of the physical designs of integrated circuit semiconductor chips.

2. Related Art

A highly specialized field, commonly referred to as "electronic design automation" (EDA), has evolved to handle the demanding and complicated task of designing semiconductor chips. In EDA, computers are extensively used to automate the design process. Computers are ideally suited to performing tasks associated with the design process because computers can be programmed to reduce or decompose large, complicated circuits into a multitude of much simpler functions. Thereupon, the computers can be programmed to iteratively solve these much simpler functions. Indeed, it has now come to the point where the design process has become so overwhelming that the next generation of integrated circuit (IC) chips cannot be designed without the help of computer-aided design (CAD) systems.

After the circuit for a new semiconductor chip has been designed and physically laid out, there still remains extensive testing which must be performed to verify that this new design and layout works properly. Different combinations of test vectors are applied as inputs to the design in order to check that the outputs are correct. In the past, many prior art simulation and verification software tools assumed constant power supply voltage sources. This approach was deficient because although the design might be functioning perfectly under the assumption of constant power supply sources, it might, nevertheless, still not meet specifications due to hidden voltage drop and electro-migration problems in interconnect wires. In real life, each of the transistors of a semiconductor circuit consumes a small amount of power (during the logic switching period). Individually, the voltage drop in the power network attributable to a single transistor is negligible. However, due to rapid advances in semiconductor technology, today's chips can contain upwards of ten million or more transistors. The cumulative effect of all these voltage drops may lead to serious performance degradation or even critical failures. For example, a transistor might be specified to be a logic "0" from 0.0 to 0.7 volts and to be a logic "1" from 3.3 to 2.1 volts. However, due to the voltage drops in the power network, a transistor output might not switch to those specified ranges and thus results in a logic error. And even if a voltage-tolerant CMOS process is used whereby the transistor has more noise margin, its switching speed is detrimentally impacted. Higher power supply voltages makes transistors switch faster, whereas lower voltages makes them switch more slowly. Consequently, if the voltage in a power network of a circuit drops below a critical level, the speed of that circuit might be reduced to an unacceptable rate.

Another problem which might arise relates to electro-migration. It has been established that high current density can cause the metal in the lines distributing the power through the semiconductor chip to migrate along the path of the current flow. Eventually, over a period of time (e.g., several years), this electro-migration can result in an open circuit so that power is cut off from parts of the IC, thereby causing the IC to fail. The electro-migration may even result in a short circuit which also causes the IC to fail.

Thus, it would be prudent to test for any potential power distribution problems as part of the overall simulation and verification process. However, testing a circuit with millions of transistors is an extremely complex and time-consuming process. It requires expert knowledge and highly skilled EDA specialists. Furthermore, it requires the dedication of a powerful and expensive computer with gigabytes of memory. Indeed, advances in semiconductor technology has led to sub-micron designs having even greater numbers of transistors being crammed into ever greater densities at higher levels of complexities which threaten the capability of today's most powerful computers to simulate.

Prior art reliability simulation tools are often based on dynamic transistor-level simulation. While these dynamic reliability simulation tools offer a high degree of accuracy in simulation results, the requirement of transistor-level simulation adversely impacts simulation speed and thus lowers the overall performance of the simulation tools. Consequently, these dynamic transistor-level reliability simulation tools have limited practical applications and are typically used only by chip designers who are willing and able to strive for high accuracy at the expense of extended design cycles. Moreover, the stringent details required in transistor-level simulation also impose capacity limitations on the circuit designs that can be simulated using dynamic simulation tools. As design complexities continue to increase, the suitability and applicability of these dynamic simulation tools will become even more severely limited.

Alternatively, prior art gate-level logic simulation tools are used by many designers to estimate the power consumption of their circuit designs. Gate-level logic simulation is typically based on the node activities that occur during a simulation run of the circuit, and gate-level simulation tools offer better performance, in terms of both simulation speed and capacity limitation, over transistor-level simulation tools. Nevertheless, gate-level simulation tools cannot serve as practical alternatives to transistor-level simulation tools for reliability analysis because gate-level simulation tools yield results that lack the level of accuracy and granularity essential to reliability analysis. Thus, use of prior art gate-level logic simulation tools is generally limited to power estimation and is typically inapplicable to reliability simulation.

Thus, there exists a need for a reliability analysis tool for simulating and verifying gigantic power network of multi-million transistor sub-micron IC designs which does not require prohibitive simulation time to generate results despite the high complexity of today's deep sub-micron IC designs and which does not deliver results of such low granularity that the results are unsuitable for reliability analysis.

SUMMARY OF THE INVENTION

Accordingly, the present invention provides a unique, efficient method and system for reliability simulation of a multi-million transistor semiconductor chip design which is common in today's deep sub-micron CMOS VLSI technology. The instant method not only generates highly accurate results suitable for reliability analysis but also delivers superior performance in terms of speed and capacity. By partitioning the complex circuit of the design into numerous smaller stages and estimating the current consumption of each stage, the method of the present invention is able to determine the individual currents of all power network transistors in a stage with sufficient accuracy for reliability simulation. The instant method then uses the individual transistor currents and additional device information, including data of an accurate RC model of the power network, to determine the branch currents and node voltages in all interconnect wires of the power network. Finally, the instant method reports all potential problems of the design identified based on the values of the branch currents and node voltages. Circuit designers can then pinpoint where voltage drop and electro-migration may pose problems. Corrective actions may thus be taken before chips are fabricated and sold. Thus, the present invention provides a novel and superior method for reliability simulation over the prior art by offering much greater simulation speed and capacity over conventional reliability simulation tools while delivering highly accurate results for reliability analysis crucial to today's deep sub-micron designs. These and other advantages of the present invention not specifically mentioned above will become clear within discussions of the present invention presented herein.

In one exemplary embodiment, device information and node activity data of a chip design is stored as they are inputted from external sources. Then, the complex transistor circuit represented by the chip design is partitioned into numerous stages such that direct current can flow within a single stage and through multiple transistors within the stage, but current cannot flow across a stage boundary. With the reduced complexity, a current can be rapidly and accurately estimated for each power network transistor within each stage based on the device information and node activity data stored earlier. Next, using the individual currents of the power network transistors derived in the previous step, node voltages and branch currents are computed for interconnect wires of the power supply network of the entire circuit. Finally, potential problems of the chip design are identified based on the simulated node voltages and branch currents and reported to the user.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Figure 1:
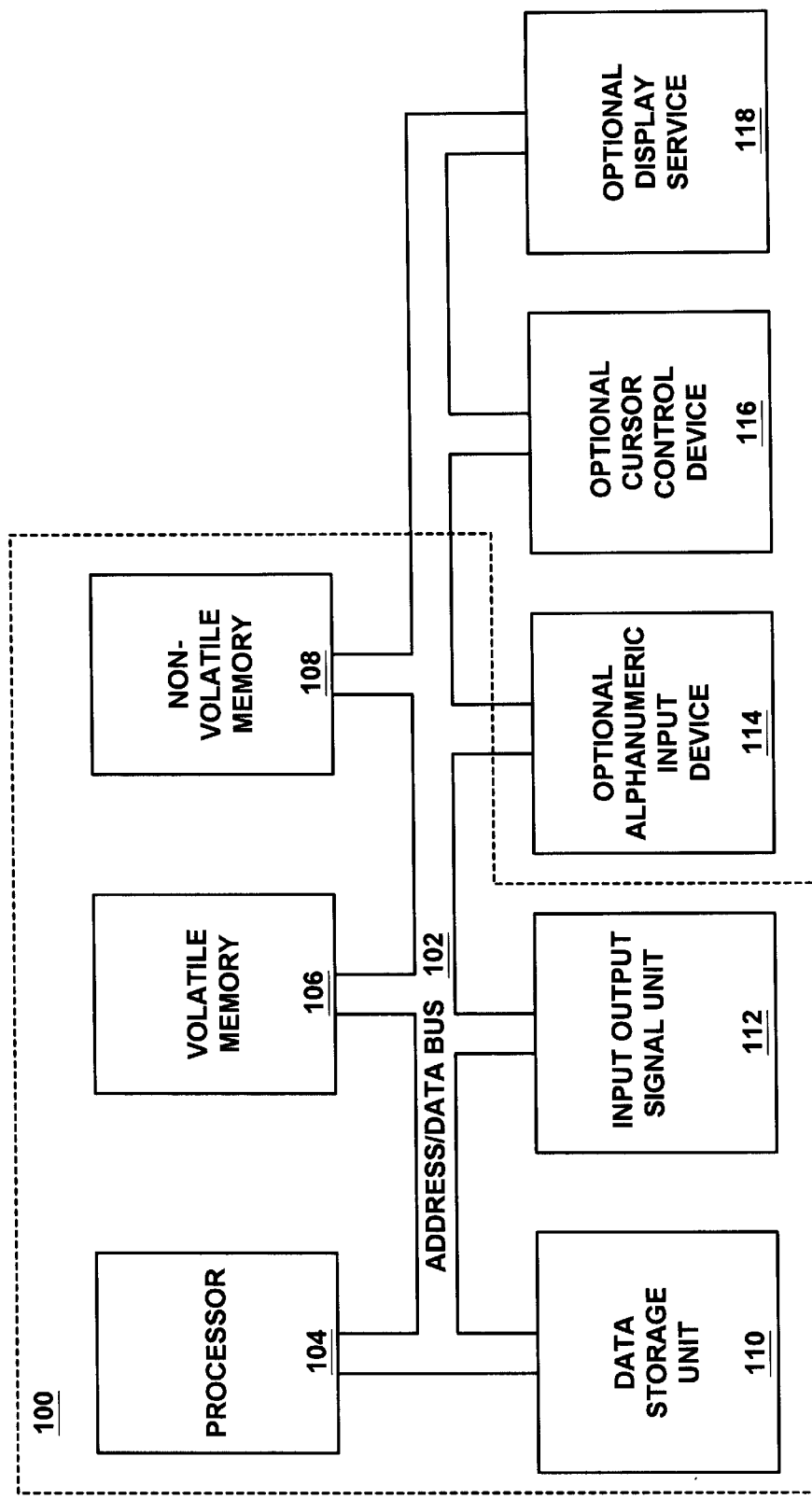
FIG. 1 is a schematic illustration of an exemplary computer system used as a part of a reliability simulation system in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proved convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing", "partitioning", "estimating", "computing", "reporting", "presenting" or the like, refer to the actions and processes of a computer system, or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. The present invention is also well suited to the use of other computer systems such as, for example, optical and mechanical computers.

COMPUTER SYSTEM ENVIRONMENT OF ONE EMBODIMENT OF THE RELIABILITY SIMULATION SYSTEM OF THE PRESENT INVENTION

With reference now to FIG. 1, portions of the present reliability simulation system are comprised of computer-readable and computer-executable instructions which reside, for example, in computer-usable media of a computer system. FIG. 1 illustrates an exemplary computer system 100 used as a part of a reliability simulation system in accordance with one embodiment of the present invention. It is appreciated that system 100 of FIG. 1 is exemplary only and that the present invention can operate within a number of different computer systems including general purpose computer systems, embedded computer systems, and stand alone computer systems specially adapted for reliability simulation systems.

System 100 of FIG. 1 includes an address/data bus 102 for communicating information, and a central processor unit 104 coupled to bus 102 for processing information and instructions. System 100 also includes data storage features such as a computer usable volatile memory 106, e.g. random access memory (RAM), coupled to bus 102 for storing information and instructions for central processor unit 104, computer usable non-volatile memory 108, e.g. read only memory (ROM), coupled to bus 102 for storing static information and instructions for the central processor unit 104, and a data storage device 110 (e.g., a magnetic or optical disk and disk drive) coupled to bus 102 for storing information and instructions. A signal input output communication device 112 (e.g. a modem) coupled to bus 102 is also included in system 100 of FIG. 1. System 100 of the present reliability simulation system also includes an optional alphanumeric input device 114 including alphanumeric and function keys is coupled to bus 102 for communicating information and command selections to central processor unit 104. System 100 may also includes an optional cursor control device 116 coupled to bus 102 for communicating user input information and command selections to central processor unit 104. System 100 of the present embodiment may also include an optional display device 118 coupled to bus 102 for displaying information.

Display device 118 of FIG. 1, utilized with the present reliability simulation system, may be a liquid crystal device, cathode ray tube, or other display device suitable for creating graphic images and alphanumeric characters recognizable to a user. Optional cursor control device 116 allows the computer user to dynamically signal the two dimensional movement of a visible symbol (cursor) on a display screen of display device 118. Many implementations of cursor control device 116 are known in the art including a trackball, mouse, touch pad, joystick or special keys on alphanumeric input device 114 capable of signaling movement of a given direction or manner of displacement. Alternatively, it will be appreciated that a cursor can be directed and/or activated via input from alphanumeric input device 114 using special keys and key sequence commands. The present invention is also well suited to directing a cursor by other means such as, for example, voice commands. A more detailed discussion of the present reliability simulation system is found below.

GENERAL DESCRIPTION OF CERTAIN EMBODIMENTS OF THE RELIABILITY SIMULATION SYSTEM OF THE PRESENT INVENTION

Flow diagrams 200 through 800, which are illustrated in FIGS. 2 through 8 and are discussed in detail below, include processes of the present reliability simulation system which, in certain embodiments, are carried out by processor 104 under the control of computer-readable and computer-executable instructions. These instructions reside, for example, in data storage features such as computer usable volatile memory 106 and/or computer usable non-volatile memory 108 of FIG. 1. The computer-readable and computer-executable instructions are used to implement, for example, the operations related to reliability simulation as performed by the present system.

Figure 2:
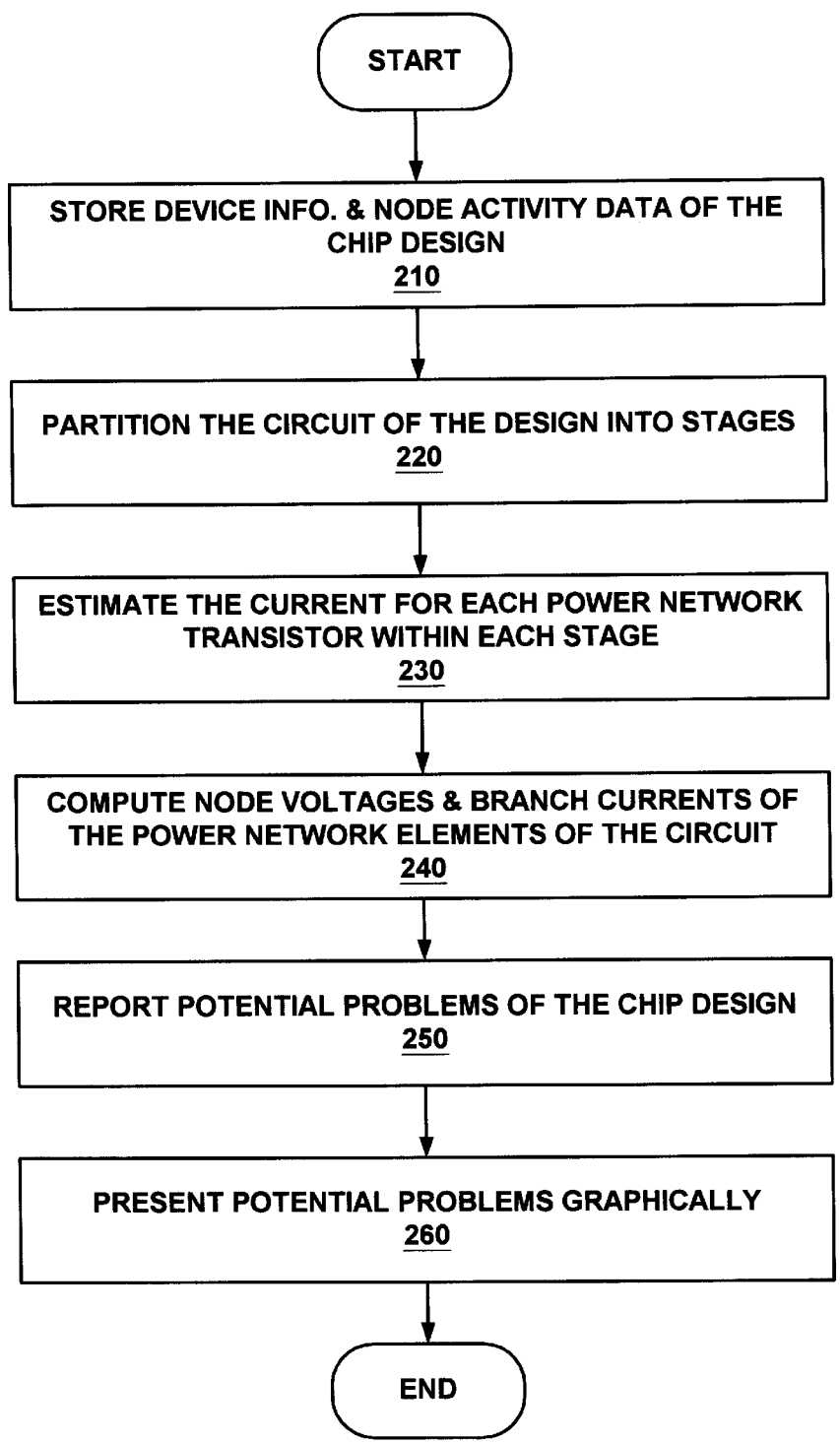
FIG. 2 is a flow diagram illustrating the reliability simulation process in accordance with one embodiment of the present invention.

FIG. 2 is a flow diagram 200 illustrating the reliability simulation process in accordance with one embodiment of the present invention. Process 200 begins with step 210. In step 210, the present reliability simulation system stores device information and node activity data of the CMOS VLSI circuit within a semiconductor chip design in computer usable volatile memory 106 and/or data storage device 110 of FIG. 1. In a preferred embodiment, the device information is stored in data structures, such as arrays in the C programming language, with respective cross-references so that the information and associated data relationships are readily accessible for subsequent processing by the present reliability simulation system. As is well known in the EDA art, the device information typically comprises transistor netlist files, device model files, lumped node capacitance files, power network resistor-capacitor (RC) extraction files and, optionally, node name mapping files. It is appreciated that while a preferred embodiment of the present invention utilizes the various types of device information as enumerated above, other similar or equivalent data which represents the device characteristics of the circuit components can also be used as inputs in accordance with the present invention.

Further, it is appreciated that the various types of device information listed above can be generated using many different commercially available tools. In a preferred embodiment, the present reliability simulation system uses RC extraction files in an ESPF file format as generated by Arcadia, a tool sold by Synopsys, Inc. of Mountain View, Calif., which takes an Arcadia database as input for generating RC extraction netlists. Specifically, popular verification programs such as Dracula and ICVerify can be used to generate an LVS/LPE database, which is then translated into an Arcadia database format for input to Arcadia. Alternatively, a GDSII database can be directly extracted into an Arcadia database format. Then, given an Arcadia database, Arcadia can generate an ESPF file comprising a RC netlist of the underlying power network, whose contents are stored in the corresponding data structures by the present reliability simulation system for subsequent use. In particular, in a preferred embodiment, each resistor in the ESPF file includes the names of its two nodes, resistance value, layer number, x and y coordinates, and width at each end. Moreover, each capacitor in the ESPF file includes the name of its non-ground node and capacitance value. Importantly, the node names in the ESPF file are constructed using a predefined naming convention such that the connectivity between transistors and power network netlists can be reconstructed subsequently. Alternatively, a user can supply a different set of naming conventions (e.g., conventions based on another tool) using the optional node name mapping file mentioned above. As such, an external RC network node in the RC netlist of the power network RC extraction file can easily be mapped to a corresponding transistor in the transistor netlist file.

On the other hand, node activity data represents node activities or toggle counts at the signal nodes of the circuit during a simulation period. A "toggle" at a node refers to a change in logic state at that node. A transition from logic "0" to logic "1" and a transition from logic "1" to logic "0" each represents a distinct "toggle". Thus, the toggle count at a node represents the frequency at which the logic state at that node changes. The toggle count or node activity is therefore a good measure of capacitive current at the corresponding node. In a preferred embodiment, the present invention uses VCS, a logic simulator from Synopsys, Inc. of Mountain View, Calif., to obtain the necessary node activity data. In this embodiment, VCS offers two orders of magnitude enhancement in both speed and capacity over typical transistor level simulators. Nevertheless, it is appreciated that node activity data can be derived either from transistor level simulation or logic level simulation using simulation tools from various vendors in accordance with the present invention.

Moreover, in a preferred embodiment, a line in an exemplary node activity file format can be represented as:

signal_node_name toggle_count_per_usec.

Most UNIX regular expression characters as used in the regex() and regcmp() functions are also supported in this preferred file format. Thus, as an example, the expression x1.x2.* will match signal names such as x1.x2.x3.M1_5 and x1.x2.x4.M2_3. In addition, multiple node activity files are also supported in a preferred embodiment. As the node activity files are read sequentially by the present reliability simulation system, each line of a file is parsed and the respective toggle count of the specified node is stored in the corresponding data structures. If the toggle count of a node is specified more than once in the file(s), the last value read will be stored. It is appreciated that given this defined file format, a node activity file can either be generated automatically by a simulator as described above or be created manually by the circuit designer in accordance with the present invention. As such, the circuit designer is afforded greater flexibility and control in specifying the toggle counts for particular signal nodes. This capability is especially useful when the circuit designer wants to designate block-wide or design-wide defaults toggle specification(s). For instance, a minimum toggle count can be specified for certain blocks within the design to ensure a conservative simulation result.

With reference still to FIG. 2, in step 220, the present reliability simulation system partitions the VLSI circuit into numerous stages. A stage essentially comprises a number of channel-connected CMOS transistors. Stated differently, transistors within a stage are connected to each other via their source or drain channels, whereas a stage boundary is found where the source or drain channel of a transistor is connected to the gate of another transistor. Thus, by definition, direct current (DC) flow, if any, is confined within a stage and is absent across stage boundaries. Importantly, it is appreciated that while the circuit is partitioned into stages at the transistor level in order to fully exploit all potential reliability problems as well as to handle different design styles (e.g., full-custom macros), stage partitioning is performed not for the purpose of simulating the circuit but rather for assigning each transistor into a stage such that the current contribution of a transistor is confined within a stage. In other words, transistor level simulation is not performed at all, so that the speed and capacity of the present reliability simulation system is dramatically enhanced when compared to prior art reliability simulation tools which employ dynamic transistor level simulation.

Next, in step 230, using the device information and node activity data stored in step 210, the present reliability simulation system accurately estimates the current for each power network transistor within each stage. In this embodiment, a power network transistor is a transistor which is represented in the transistor netlist and whose source or drain is connected directly to the power network. Importantly, it is appreciated that the currents for individual power network transistors thus computed are highly accurate and thus are suitable for reliability simulation.

Thus, by partitioning the complex circuit of the chip design into numerous stages, as described above with respect to step 220, and then accurately estimating the individual drain-to-source currents of each power network transistor on a stage-by-stage basis, as described above with respect to step 230, a preferred embodiment of the present invention is capable of efficiently and accurately analyzing a multi-million transistor VLSI circuit without simulating the entire circuit at transistor level. As such, the present reliability simulation system offers dramatic speed and capacity improvements over prior art reliability simulation tools while maintaining the high accuracy dictated by deep sub-micron designs.

Next, in step 240, in one embodiment, the present reliability simulation system computes the node voltages and branch currents of the circuit using the results obtained in step 230 above. More specifically, once the current contribution of each power network transistor is determined in step 230, the present reliability simulation system applies those results to solve the resistive network equation (Yv=i) and thus derive the node voltages and branch currents therefrom. Specifically, in the equation, Y represents the conductance matrix of the underlying resistive network, whereas v and i are vectors representing the voltages and currents at the nodes of the resistive network. It is appreciated that application of the resistive network equation in this respect is well known in the art. In particular, the equation and its application is described in detail in chapter 2 of *Electric Circuit and System Simulation Methods* co-authored by L. T. Pillage, R. A. Rohrer and C. Visweswariah and published in 1994 by McGraw-Hill, Inc., which is hereby incorporated by reference.

Once the node voltages and branch currents are determined in step 240, potential problems are isolated and reported in step 250. For example, the voltage drop at a particular node may be too much so that the voltage drop threshold will potentially be violated, or the current density through a particular interconnect wire may be too high so that electro-migration will possibly result. The circuit designer may then choose to resolve potential voltage drop and electro-migration issues by modifying the design or layout.

Furthermore, in optional step 260, in one embodiment of the present reliability simulation system, the potential electro-migration and/or voltage drop violations identified in step 250 are presented graphically to the circuit designer via a graphical chip viewer. In particular, the chip viewer overlays the reliability violations on top of the layout geometries of the chip, and thus highlights all potential problem areas of the chip design distinctly through a visual presentation. Process 200 then terminates.

Figure 3:
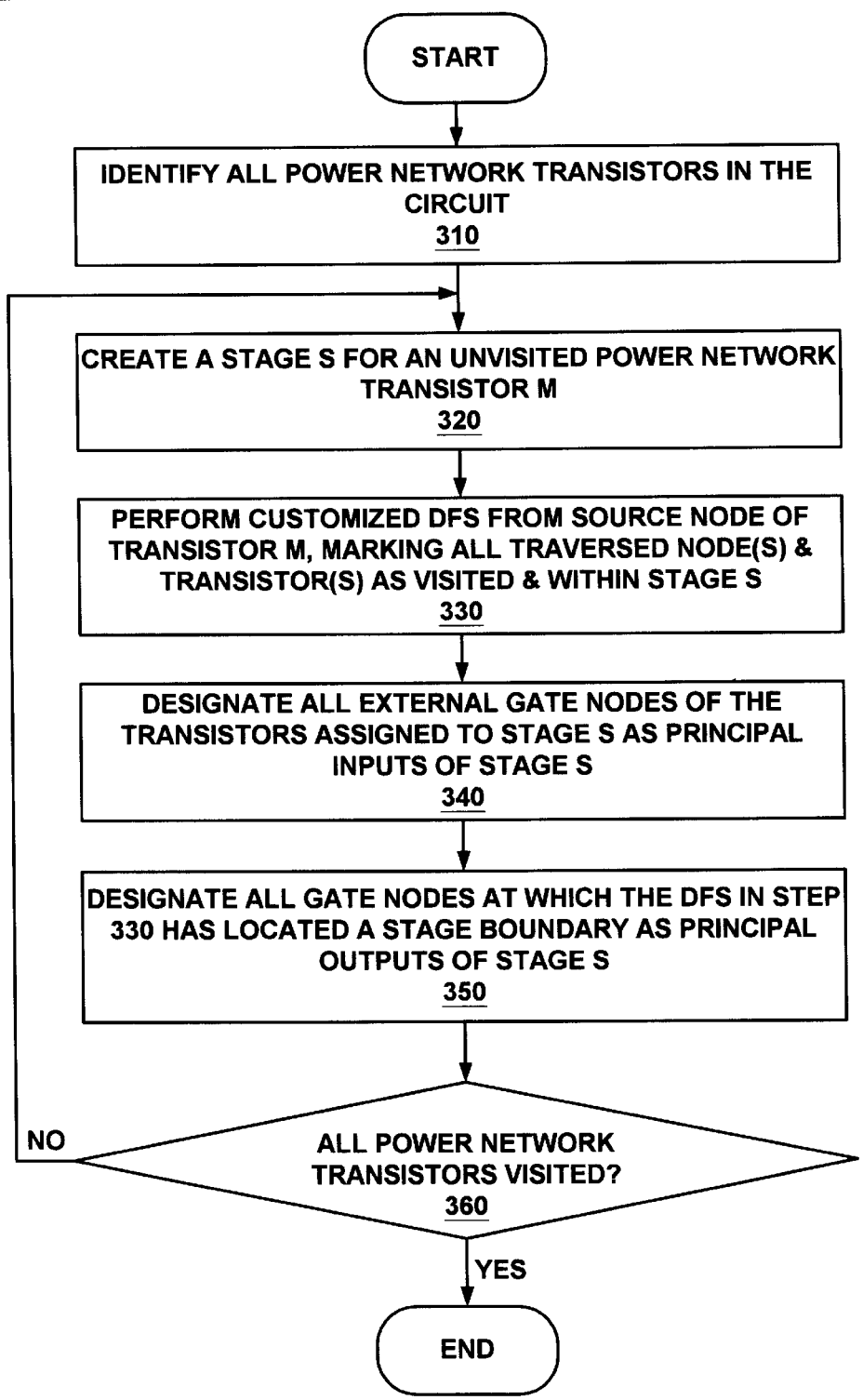
FIG. 3 is a flow diagram illustrating the steps used by one embodiment of the present invention to partition the circuit of a chip design into multiple stages.

Referring next to FIG. 3, a flow diagram 300 illustrating the steps used by one embodiment of the present invention to partition the circuit of a chip design into multiple stages is shown. Process 300 begins with step 310. In step 310, the present reliability simulation system identifies, from among all the transistors in the VLSI circuit, those transistors that are directly connected to the power network (e.g., power network transistors). These power network transistors will serve as the starting points for delineating stage boundaries in the subsequent steps described in detail below.

Next, in step 320, the present reliability simulation system creates a stage S for an unvisited power network transistor M. An unvisited transistor means that the transistor has not yet been assigned to a stage by the partitioning process. Once a transistor has been marked as visited, it belongs to a stage created earlier in the partitioning process and thus needs no further examination.

Then, in step 330, the present reliability simulation system performs a customized depth-first search (DFS) from the source node of transistor M to locate the boundaries of the current stage S. A DFS is a well known method in the art commonly used to traverse connected graphs, such as the linked arrays used for storing signal nodes and transistors in the present invention. In a preferred embodiment, the present reliability simulation system employs a customized DFS which does not explore a branch further whenever the search encounters VDD, GND, a gate node or a pin/pad. It is appreciated that VDD, GND, a gate node or a pin/pad indicates the proper location of a stage boundary because a DC does not flow beyond such a point in the circuit. In other words, the DFS continues to traverse deeper into a branch as long as a source or drain node of another transistor is encountered during the traversal. As the search proceeds, the present reliability simulation system marks all traversed nodes and transistors as visited and also assigns them to the current stage S.

Next, in step 340, the present reliability simulation system designates all external gate nodes of the transistors assigned to stage S in step 330 as principal inputs of stage S. It is appreciated that an external gate node of a stage is not necessarily a power network transistor. An external gate node is located at the boundary of the stage to which it belongs. Specifically, external gate nodes of stage S serve as the interface between stage S and its adjacent stage(s) or a pin/pad, and thus they represent the input signals to stage S. These input signals will be used to resolve unspecified toggle counts of certain internal signal nodes, as described in detail with respect to steps 540 through 570 of FIG. 5 below.

Next, in step 350, the present reliability simulation system designates all gate nodes at which the DFS in step 330 has located a stage boundary as principal outputs of stage S. By definition, these nodes represent the output signals of stage S and are typically inputs to an adjacent stage.

Finally, in step 360, the present reliability simulation system ensures that all power network transistors have been examined and that each transistor has been assigned to a stage. Specifically, steps 320 through 350 are repeated as long as there are power network transistors remaining to be visited. When it is determined that all power network transistors have been visited and assigned to a stage, process 300 terminates.

Thus, upon the completion of process 300, the present reliability simulation system has partitioned the entire circuit of the chip design into numerous stages. All power network transistors have been assigned to one of the stages. All signal nodes, principal inputs and principal outputs for each stage have been identified and stored in the corresponding data structures.

Figure 4:
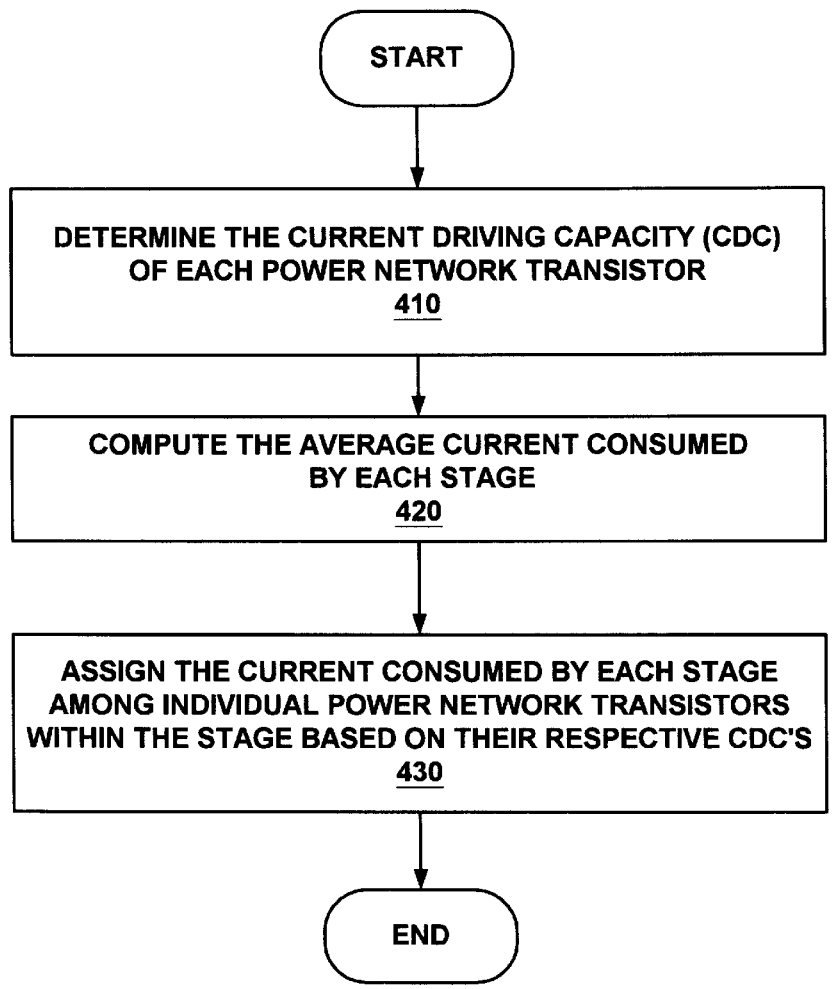
FIG. 4 is a flow diagram illustrating the steps used by one embodiment of the present invention to estimate the individual current of each power network transistor.

Referring next to FIG. 4, a flow diagram 400 illustrating the steps used by one embodiment of the present invention to estimate the individual current of each power network transistor is shown. Process 400 begins with step 410. In step 410, the current driving capacity (CDC) of each power network transistor is determined using the device information and node activity data.

Next, in step 420, the average current consumed by each stage is computed based on the toggle counts and capacitive loads at all signal nodes.

Then, in step 430, the current consumed by each stage is assigned among the individual power network transistors within the stage based on those transistors' respective current driving capacities.

Importantly, the currents for individual power network transistors computed by process 400 are sufficiently accurate to be used for reliability simulation, including electromigration and DC voltage drop analyses in particular.

Figure 5:
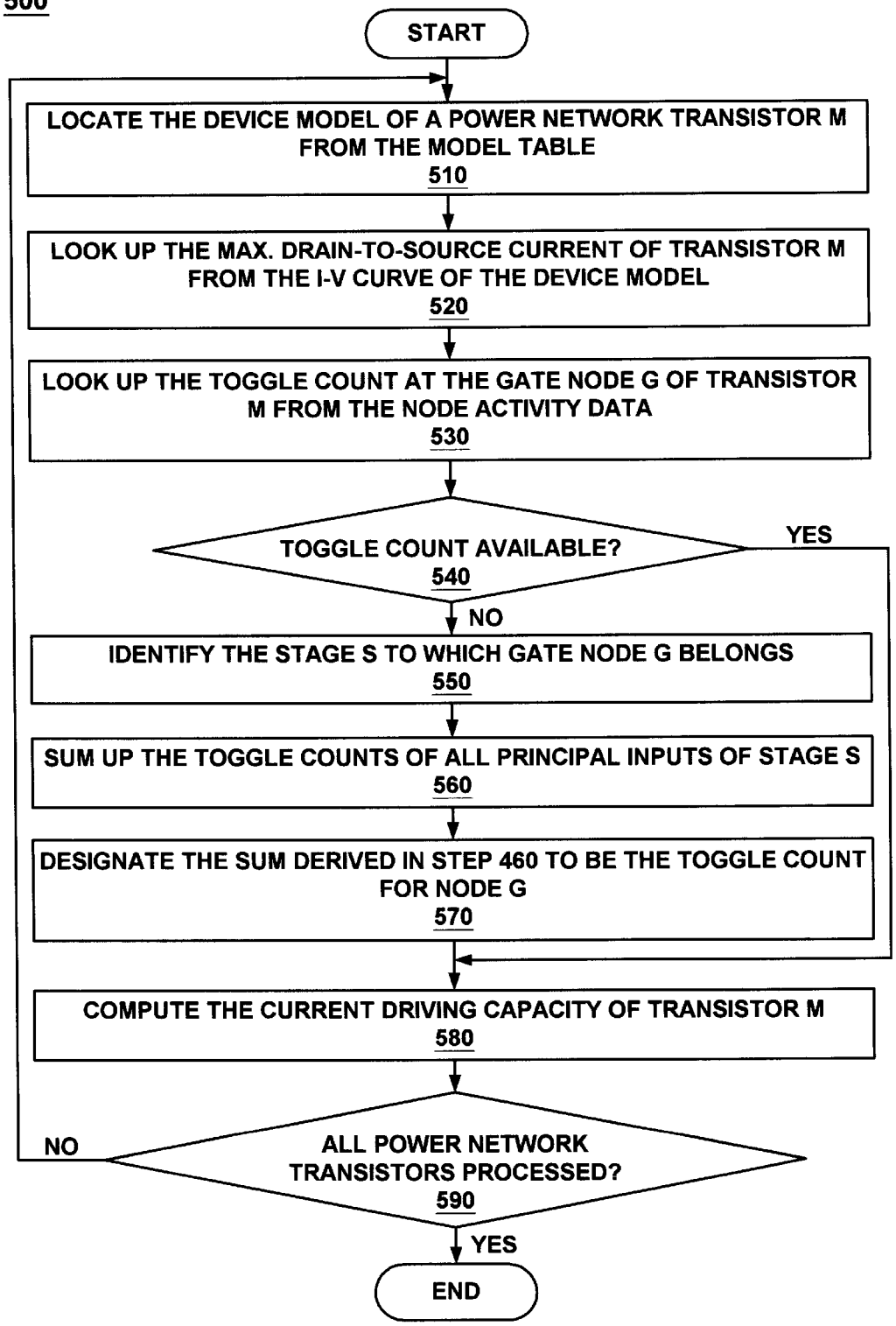
FIG. 5 is a flow diagram illustrating the steps used by one embodiment of the present invention to compute the current driving capacity (CDC) of each power network transistor.

Referring next to FIG. 5, a flow diagram 500 illustrating the steps used by one embodiment of the present invention to compute the current driving capacity (CDC) of each power network transistor is shown. Starting with step 510, in one embodiment, the present reliability simulation system locates the device model of a transistor M from the device model files. As described above, the device model files are stored by the system in step 210 of process 200.

Then, in step 520, the present reliability simulation system looks up the maximum drain-to-source current ($I_{ds,max}$) of transistor M from the device model located in step 510. Particularly, $I_{ds,max}$ of transistor M can be found from the I-V curve of the device model.

Next, in step 530, the present reliability simulation system looks up the toggle count at the gate node G ($t_G$) of transistor M from the node activity data, which has been stored by the system in step 210 of process 200.

It is appreciated that node activity files generated by a gate level logic simulator do not include toggle counts for internal nodes of library cells. For example, complicated logic cells such as full adders comprise various internal nodes whose toggle counts are not reported by a logic simulator. Yet, the present invention requires toggle counts for all signal nodes, including internal nodes within logic cells, so that the RC extraction data, which is derived from a transistor level layout, can be used. Therefore, in step 540, the present reliability simulation system determines whether a toggle count for gate node G is available directly from the node activity data, that is, whether the lookup in step 530 is successful. If it is determined that the corresponding toggle count is not reported in the node activity data, the present reliability simulation system performs steps 550 through 570, described in detail below, to derive an appropriate value for the toggle count of node G.

Thus, still referring to FIG. 5, in step 550, the present reliability simulation system identifies the stage S to which gate node G belongs. Specifically, this information has been stored by process 300 in step 330 and is therefore readily available.

Then, in step 560, the present reliability simulation system sums up the individual toggle counts of all principal inputs of stage S. It is appreciated that the principal inputs of stage S is readily ascertainable because this information has been stored by step 340 of process 300. Moreover, the toggle counts of all such principal inputs are readily available from the node activity data stored by the system in step 210 of process 200 because, by definition, all principal inputs are external nodes of a library cell and their toggle counts are reported in the node activity data generated by a logic simulator.

Next, in step 570, the present reliability simulation system designates the sum derived in step 560 above as the toggle count for node G. It is appreciated that the sum of the individual toggle counts of all principal inputs of stage S represents a worst case scenario for the toggle count of node G. More specifically, the signal at an internal node of a stage can change, at a maximum, so many times as the total number of signal changes at all principal input nodes of the same stage. This is because the signal at the internal node is dependent on the signal changes at the principal inputs. Thus, the most conservative and safest surrogate for the actual toggle count at node G is the sum of the individual toggle counts of all principal inputs. As such, upon the completion of step 570, any given signal node G will have an appropriate value assigned to its toggle count ($t_G$), and process 500 proceeds to step 580.

On the other hand, still referring to FIG. 5, if it is determined in step 540 that the toggle count for node G is already available from the node activity data, process 500 proceeds directly to step 580. In step 580, the present reliability simulation system computes the current driving capacity of transistor M. In particular, the current driving capacity of transistor M is defined as the product of its oate node's toggle count and its maximum drain-to-source current:

$$CDC=t_G*I_{ds,max}$$

It is appreciated that the current contribution by a power network transistor to a stage during a simulation period is directly proportional to the maximum current that the transistor can draw each time it is turned on and also the frequency at which the transistor is turned on during the simulation period. Hence, the CDC of a given power network transistor as defined is an accurate and reliable indicator of the ability of that particular transistor, relative to other power network transistors within the same stage, to contribute to the overall current of the stage.

Finally, in step 590, the present reliability simulation system ensures that all power network transistors have been examined and that the current driving capacity of each power network transistor has been computed. Specifically, steps 510 through 540 (and steps 550 through 570 if determined in step 540 to be necessary for a particular signal node) are repeated as long as there are power network transistors remaining to be processed. When it is determined that every power network transistor has been assigned a corresponding CDC, process 500 terminates.

Thus, upon the completion of process 500, the present reliability simulation system has computed the current driving capacity (CDC) of each power network transistor.

Figure 6:
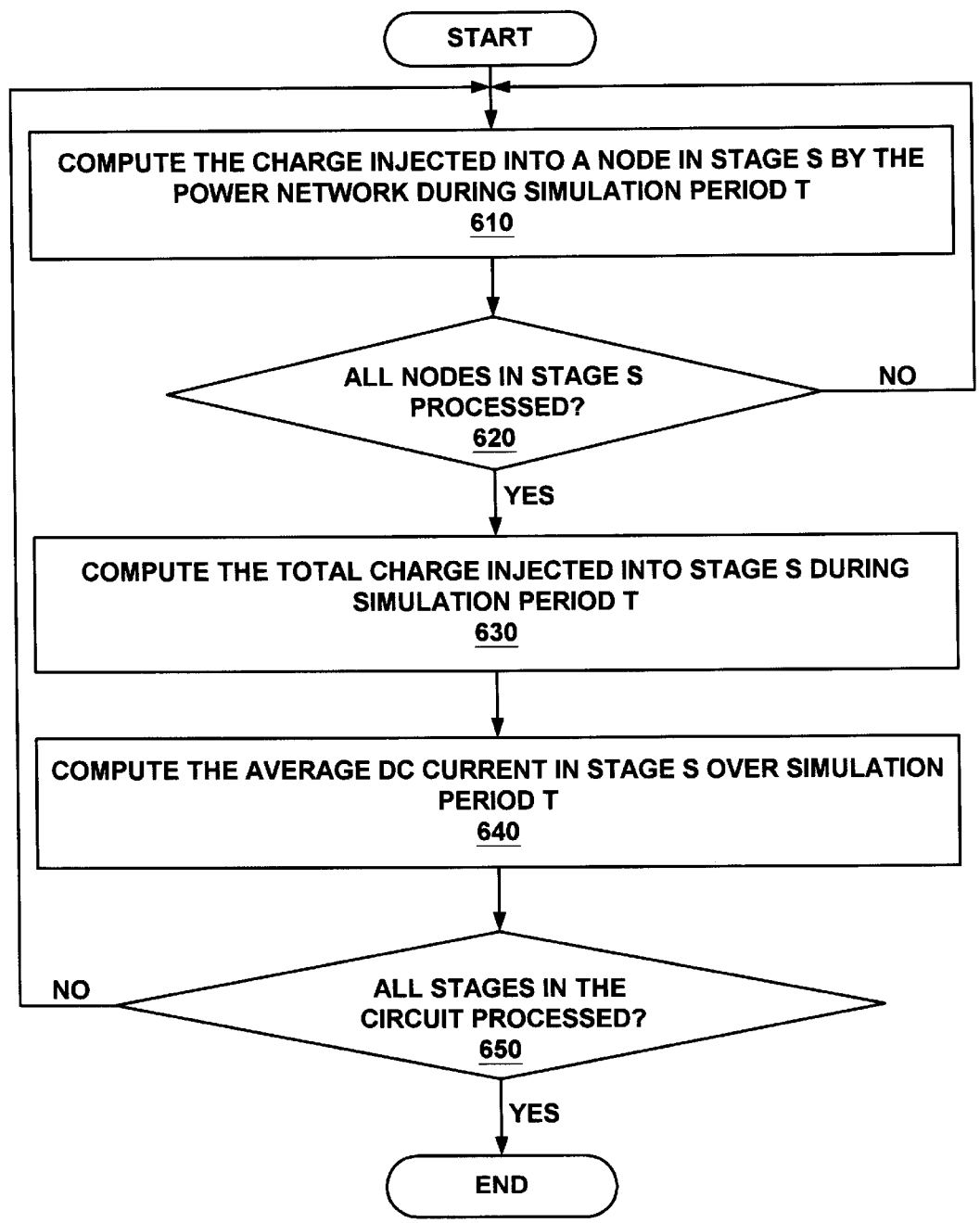
FIG. 6 is a flow diagram illustrating the steps used by one embodiment of the present invention to compute the current consumption of each stage.

With reference next to FIG. 6, a flow diagram 600 illustrating the steps used by one embodiment of the present invention to compute the current consumption of each stage is shown. Starting with step 610, the present reliability simulation system computes the charge Q injected into a node in a stage S by the power network during a given simulation period T. In one embodiment, the charge Q is derived as the product of three values, namely, the number of logic "0" to logic "1" transitions at the node during time T, the capacitance C at the node, and the voltage provided by the power network. It is appreciated that the number of "0" to "1" transitions at the node equals half the value of the toggle count $t_n$ of the node, which is readily available as stored in step 210 of process 200. The capacitance C at the node comprises the capacitance from the corresponding device(s) and interconnect wires, which can be identified from the information in device model files and lumped node capacitance files as stored in step 210 of process 200. In one embodiment, where the power network is a VDD network, the voltage provided by the power network equals the power supply voltage $V_{CC}$. Thus, in this embodiment, the charge Q injected into the node can be represented algebraically as:

$$Q=\frac{1}{2}*t_n*C*V_{CC}$$

Then, in step 620, the present reliability simulation system ensures that all nodes in stage S have been processed and that the charge injected into each node has been computed. Specifically, step 610 is repeated as long as there are nodes remaining to be processed. When it is determined that every node has been assigned a corresponding charge, process 600 proceeds to step 630.

Next, in step 630, the present reliability simulation system computes the total charge $Q_{total}$ injected into stage S by the power network during the simulation period T. Specifically, the total charge injected into the stage during a given period equals the sum of the charges injected into each node within the stage during the same period, where all individual node charges are as derived in step 610 above.

Then, in step 640, the present reliability simulation system computes the average DC current in stage S provided by the power network during the simulation period T. Specifically, the average DC current $I_{avg}$ equals the total charge $Q_{total}$ injected into stage S by the power network during the simulation period T divided by the simulation time T, where $Q_{total}$ is as derived in step 620 above. Thus, in this embodiment, the average DC current $I_{avg}$ in stage S provided by the power network during the simulation period T can be represented algebraically as:

$$I_{avg}=Q_{total}/T$$

Finally, in step 650, the present reliability simulation system ensures that all stages in the circuit have been processed and that the average DC current in each stage has been computed. Specifically, steps 610 through 640 are repeated as long as there are stages remaining to be processed. When it is determined that every stage has been assigned a corresponding average DC current, process 600 terminates.

Thus, upon the completion of process 600, the present reliability simulation system has computed for each stage the average DC current $I_{avg}$ over simulation period T.

Figure 7:
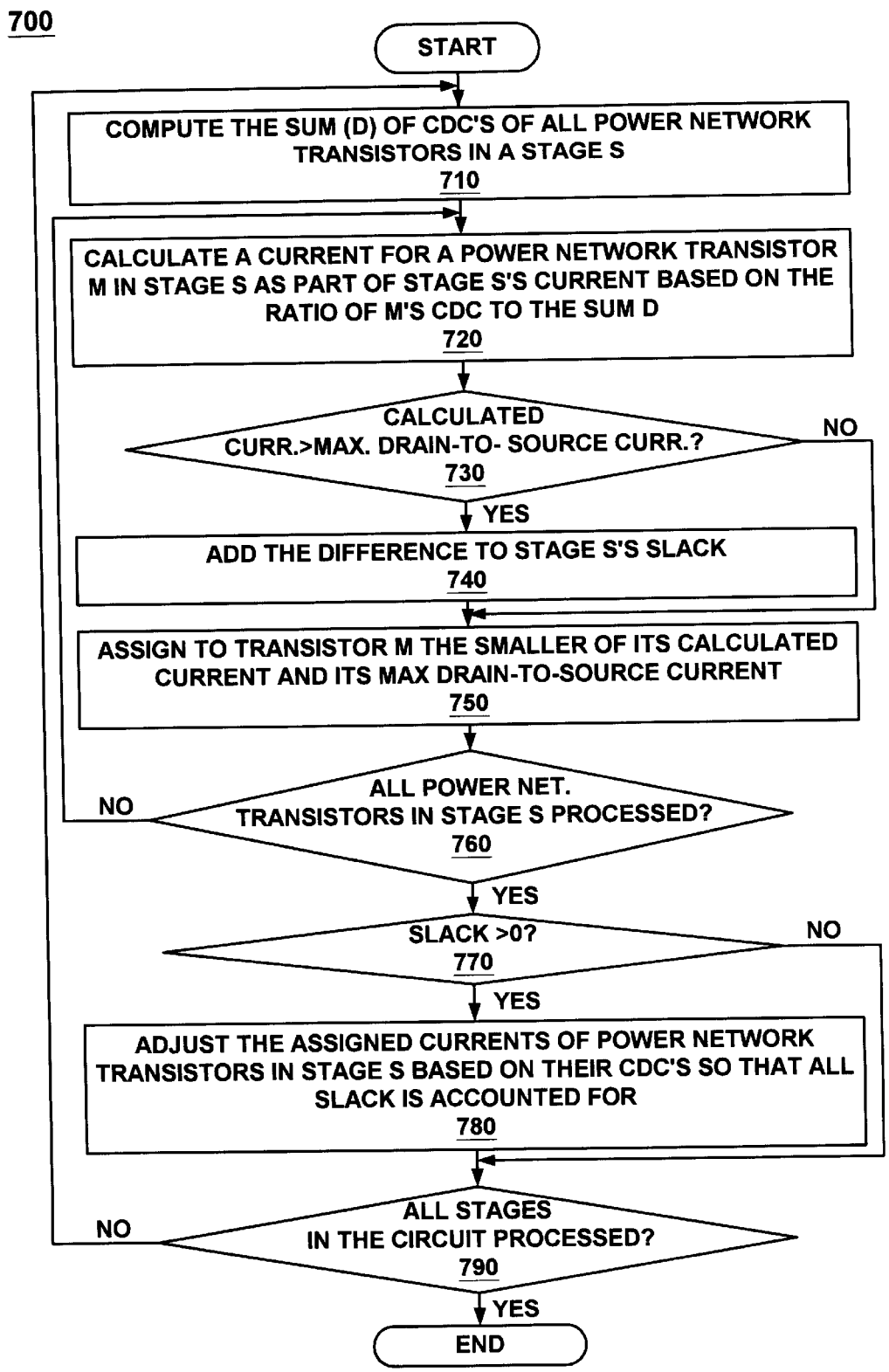
FIG. 7 is a flow diagram illustrating the steps used by one embodiment of the present invention to assign a current to each power network transistor.

With reference next to FIG. 7, a flow diagram 700 illustrating the steps used by one embodiment of the present invention to assign a current to each power network transistor is shown. Starting with step 710, in one embodiment, the present reliability simulation system computes the sum of the CDC's of all power network transistors which belong to a stage S. For ease of illustration, the sum of CDC's is denoted as D. It is noted that the CDC of each of the power network transistors has been computed by process 500 above and is therefore readily available.

Then, in step 720, the present reliability simulation system calculates a current $I_{calc}$ for a power network transistor M as part of the average DC current in stage S ($I_{avg}$ as computed in step 640 of process 600 above) based on the ratio of transistor M's CDC to the sum D (CDC ratio). It is appreciated that the relative capability of transistor M to contribute to $I_{avg}$ of stage S during a simulation period compared to those of other power network transistors in stage S can be represented by the CDC ratio as defined. Hence, a calculated value for the current of transistor M as a portion of the average DC current of stage S can be represented algebraically as:

$$I_{calc}=I_{avg}*(CDC/D)$$

where lcaic and CDC is the calculated current for transistor M and the current driving capacity of transistor M, respectively.

Next, in step 730, the present reliability simulation system compares the calculated current $I_{calc}$ and the maximum drain-to-source current $I_{ds,max}$ of transistor M. It is noted that $I_{calc}$ is as computed in step 720 above, whereas $I_{ds,max}$ can be found from the I-V curve of the device model for transistor M.

If it is determined in step 730 that $I_{calc}$ is larger than $I_{ds,max}$ then process 700 proceeds to step 740, wherein the present reliability simulation system adds the difference between $I_{calc}$ and $I_{ds,max}$ to the slack $I_{slack}$ of stage S. It is appreciated that the slack of stage S represents portions of $I_{avg}$ of stage S that will remain unassigned to a particular power network transistor in stage S in step 750 below, but will be apportioned among the transistors later in steps 770 and 780 further below. Upon completion of step 740, process 700 proceeds to step 750.

On the other hand, if it is determined in step 730 that $I_{calc}$ is not larger than $I_{ds,max}$, then process 700 proceeds directly to step 750, thus skipping step 740. In step 750, based on the comparison in step 730, the present reliability simulation system assigns the smaller of transistor M's calculated current $I_{calc}$ and maximum drain-to-source current $I_{ds,max}$ to be the assigned current $I_{assign}$ of transistor M. As such, transistor M is assigned a current whose magnitude is at most the same as its maximum drain-to-source current but not exceeding it. As discussed above, it is appreciated certain portions of $I_{avg}$ of stage S that can remain unassigned to a particular power network transistor in stage S here in step 750. As described in step 740, such slack will be apportioned among the transistors in steps 770 and 780 below.

Then, in step 760, the present reliability simulation system ensures that all power network transistors in stage S have been examined and that a value for $I_{assign}$ has been assigned to each transistor. Specifically, steps 720 through 750 are repeated as long as there are power network transistors in stage S remaining to be processed. When it is determined that all power network transistors in stage S have been examined and each has a value for $I_{assign}$, process 700 proceeds to step 770. At this point, the total slack of stage S is represented by $I_{slack}$, whose value has been accumulated over the iterations of steps 720 through 750.

Next, in step 770, the present reliability simulation system determines whether, after the initial current assignment performed by steps 720 through 760, there exists any slack in stage S (e.g., $I_{slack}>0$). It is appreciated that the existence of a slack indicates that some of the average DC current $I_{avg}$ of stage S has not yet been accounted for by the power network transistors in stage S.

Thus, if it is determined in step 770 that a slack exists, process 700 proceeds to step 780, wherein the present reliability simulation system adjusts the assigned currents of the power network transistors in stage S based on their respective CDC's so that the entirety of the slack of stage S is accounted for. Process 700 then proceeds to step 790.

If, on the other hand, it is determined in step 770 that stage S has no slack (e.g., $I_{slack}=0$) after the initial current assignment performed by steps 720 through 760, then process 700 proceeds directly to step 790. In this scenario, the entire amount of the average DC current $I_{avg}$ of stage S has been accounted for and thus no further adjustment to the assigned currents of the transistors is needed.

Finally, in step 790, the present reliability simulation system ensures that all stages in the circuit have been processed and that the average DC current of each stage has been properly assigned among the power network transistors in stage S. Specifically, steps 710 through 780 are repeated as long as there are stages remaining to be processed. When it is determined that every stage1s $I_{avg}$ has been properly accounted for, process 700 terminates.

Thus, upon the completion of process 700, the present reliability simulation system has assigned the average DC current $I_{avg}$ of each stage among its power network transistors.

Figure 8:
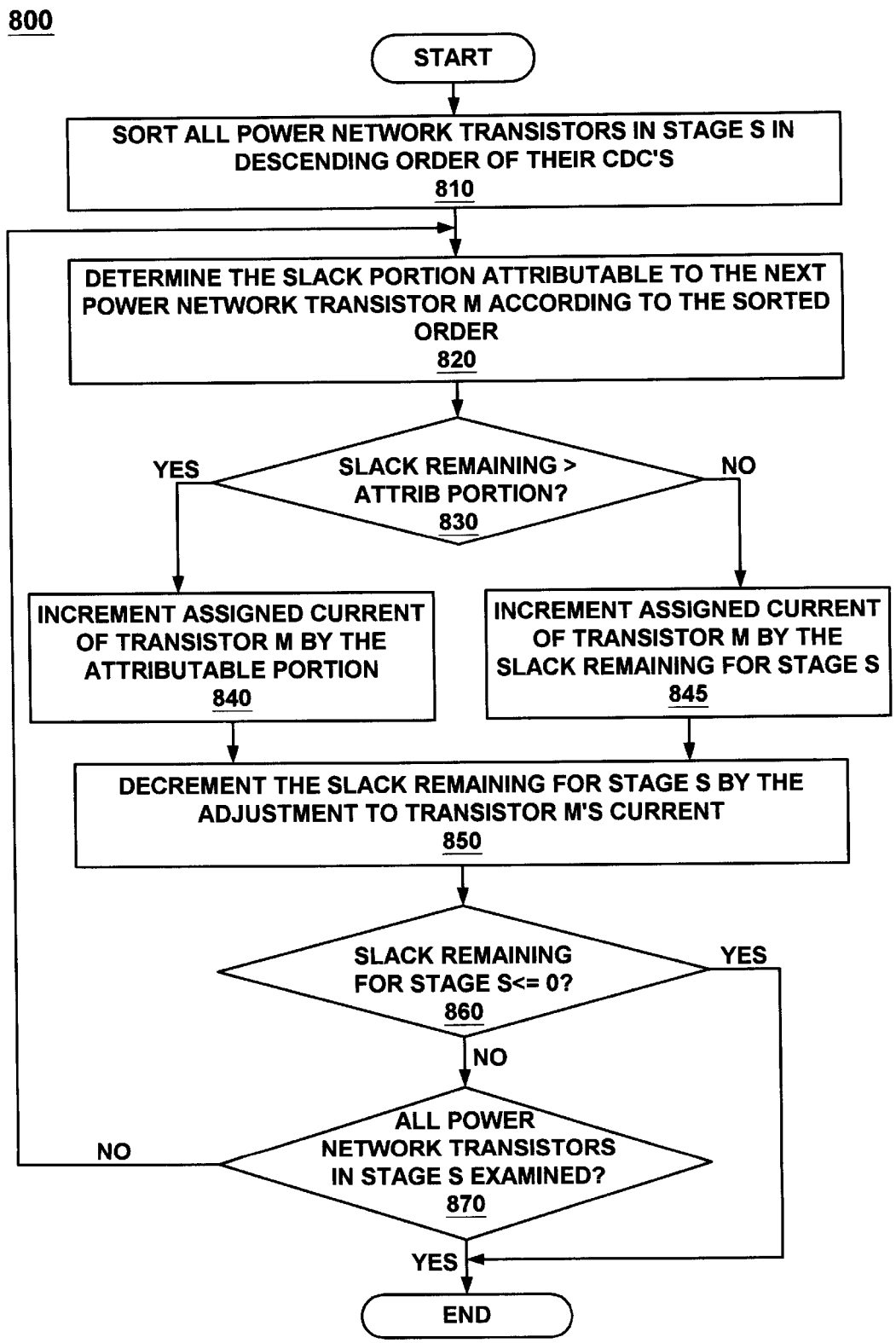
FIG. 8 is a flow diagram illustrating the steps used by one embodiment of the present invention to adjust the assigned currents of power network transistors for slack within a stage.

With reference next to FIG. 8, a flow diagram 800 illustrating the steps used by one embodiment of the present invention to adjust the assigned currents of power network transistors for slack within a stage is shown. Starting with step 810, in one embodiment, the present reliability simulation system sorts all power network transistors in a stage S in descending order of their respective CDC's.

Next, in step 820, the present reliability simulation system determines, according to the sorted order established in step 810, the portion of the slack of stage S attributable to the next power network transistor M. More specifically, the portion of slack attributable to transistor M is defined as the difference between its maximum drain-to-source current $I_{ds,max}$ and its assigned current $I_{assign}$ as computed in step 750 of process 700. Thus, if the assigned current $I_{assign}$, of transistor M is already equal to its maximum drain-to-source current $I_{ds,max}$, no slack is attributable to transistor M.

Then, in step 830, the present reliability simulation system compares the slack $I_{slack}$ remaining for stage S and the portion attributable to transistor M as determined in step 820.

If it is determined in step 830 that the remaining slack $I_{slack}$ is greater than the portion of slack attributable to transistor M, then process 800 proceeds to step 840, wherein the present reliability simulation system increments the assigned current $I_{assign}$ of transistor M by the portion attributable to transistor M as determined in step 820. Process 800 then proceeds to step 850.

On the other hand, if it is determined in step 830 that the remaining slack $I_{slack}$ is not larger than the portion of slack attributable to transistor M as calculated in step 820, then process 800 proceeds instead to step 845. In step 845, the present reliability simulation system increments the assigned current $I_{assign}$ of transistor M by the remaining slack $I_{slack}$. Process 800 then proceeds to step 850.

Thus, after the adjustment in step 840 or step 845, the assigned current $I_{assign}$ of transistor M is at most as large as its maximum drain-to-source current $I_{ds,max}$ but not exceeding it. Moreover, it is appreciated that the power network transistors are processed in descending order of their respective CDC's because a transistor with a larger CDC value is more capable of contributing to the average DC current of stage S than another transistor having a smaller CDC value. Therefore, the remaining slack of stage S is apportioned to the power network transistors having larger CDC values prior to the transistors having lower CDC values.

Then, in step 850, the present reliability simulation system decrements the remaining slack $I_{slack}$ of stage S by the adjustment to the assigned current $I_{assign}$, of transistor M to reflect that a portion of the slack has been accounted for by the adjustment performed in step 840 or step 845.

Next, in step 860, the present reliability simulation system determines whether the slack of stage S has been fully accounted for. Specifically, if it is determined that stage S no longer has any slack remaining ($I_{slack}=0$), then process 800 terminates, because the average DC current $I_{avg}$ of stage S has been fully assigned among the power network transistors in stage S.

On the other hand, if it is determined in step 860 that stage S still has certain slack remaining ($I_{slack}>0$), then process 800 proceeds to step 870. In step 870, the present reliability simulation system ensures that the assigned current of the next power network transistor is adjusted for slack as long as $I_{slack}$ is greater than zero. Specifically, steps 820 through 860 (with either step 840 or step 845 selected as appropriate) are repeated as long as further adjustments to the assigned currents of the power network transistors in stage S are necessary. When it is determined that all power network transistors in stage S have been examined and no slack remains for stage S, process 800 terminates.

It is appreciated that in certain embodiments described above, the present invention has been illustrated with reference to a VDD network without loss of generality. Specifically, it is appreciated that other types of power networks not expressly enumerated, such as a GND network, can also be used in accordance with the present invention.

The preferred embodiment of the present invention, a method and system for reliability analysis of CMOS VLSI circuits based on stage partitioning and node activities, is thus described. While the present invention has been described in particular embodiments, it should be appreciated that the present invention should not be construed as limited by such embodiments, but rather construed according to the below claims.

What is claimed is:

1. A method for performing reliability analysis of a semiconductor chip design, said method comprising the computer implemented steps of:
   a) storing device information and node activity data of a circuit within said chip design, wherein said circuit comprises a power network, a plurality of power network transistors and a plurality of signal nodes;
   b) partitioning said circuit into a plurality of stages, wherein each of said stages comprises a subset of said power network transistors and a subset of said signal nodes, and wherein a flow of direct current across said stages is absent;
   c) estimating a current for each of said power network transistors within each of said stages using said node activity data and said device information;
   d) computing node voltages and branch currents of said power network using said currents of said power network transistors; and
   e) reporting potential problems of said chip design based on said node voltages and said branch currents of said power network.

2. The method as recited in claim 1 wherein said stage partitioning is achieved by performing a plurality of depth-first searches (DFS) on said power network transistors, wherein a boundary between two of said stages is established whenever one of VDD, GND, a gate node of a transistor of said circuit and a pad of said circuit is encountered during one of said DFS.

3. The method as recited in claim 2 wherein said stage partitioning comprises the steps of:
   b1) identifying said power network transistors in said circuit;
   b2) creating one of said stages for one of said power network transistors, wherein said one power network transistor is unassigned; and
   b3) performing said DFS from a source node of said unassigned power network transistor of said step b2);
   wherein those of said power network transistors and said signal nodes which are encountered during said DFS of said step b3) are assigned to said stage created in said step b2); and wherein said steps b2) and b3) are repeated until each of said power network transistors has been assigned to one of said stages.

4. The method as recited in claim 1 wherein said step c) comprises the steps of:
   c1) determining a current driving capacity (CDC) for each of said power network transistors;
   c2) computing an average current for each of said stages; and
   c3) assigning portions of said average current of one of said stages among said power network transistors within said stage using said current driving capacities of said power network transistors, and wherein said step c3) is performed for each of said stages.

5. The method as recited in claim 4 wherein said step c1) comprises the steps of:
   c1a) identifying a maximum drain-to-source current for one of said power network transistors using said device information;
   c1b) determining a toggle count for said gate node of said power network transistor of said step c1a); and
   c1c) computing said CDC of said power network transistor of said step c1a) using said maximum drain-to-source current and said toggle count for said gate node of said power network transistor;
wherein said steps c1a), c1b) and c1c) are repeated until said CDC of each of said power network transistors has been computed.

6. The method as recited in claim 5 wherein said step c1b) comprises the steps of:
   c1b1) looking up a first value for said toggle count for said gate node from said node activity data;
   c1b2) computing a second value for said toggle count for said gate node, provided that said lookup of said first value in said step c1b1) is unsuccessful;
   c1b3) returning said first value as said toggle count for said gate node, provided that said lookup of said first value in said step c1b1) is successful; and
   c1b4) returning said second value as said toggle count for said gate node, provided that said lookup of said first value in said step c1b1) is unsuccessful.

7. The method as recited in claim 6 wherein said step c1b2) comprises the steps of:
   identifying that particular one of said stages to which said gate node is assigned;
   identifying all principal inputs of said stage;
   computing a sum by adding up said toggle counts of said principal inputs of said stage; and
   designating said sum as said second value of said toggle count for said gate node.

8. The method as recited in claim 4 wherein said step c2) comprises the steps of:
   c2a) computing a charge injected into each of said signal nodes of one of said stages during a simulation period using said device information;
   c2b) computing a total charge injected into said stage during said simulation period by adding up said charges injected into said signal nodes of said stage; and
   c2c) computing said average current for said stage using said total charge injected into said stage and said simulation period;
wherein said steps c2a), c2b) and c2c) are repeated until said average current of each of said stages in said circuit has been computed.

9. The method as recited in claim 4 wherein said step c3) comprises the steps of:
   c3a) computing a ratio by adding up said CDC of said power network transistors in one of said stages;
   c3b) computing a transistor current for each of said power network transistors in said stage and a slack current for said stage using said ratio, said maximum drain-to-source currents of said power network transistors and said average current of said stage; and
   c3c) adjusting said transistor currents of said power network transistors in said stage by apportioning said slack current of said stage among said power network transistors based on said CDC of said power network transistors, provided that said slack current for said stage is non-zero;

wherein said steps c3a), c3b) and c3c) are repeated until said transistor current has been assigned, and adjusted when determined to be necessary by said step c3c), for each of said power network transistors in each of said stages in said circuit.

10. The method as recited in claim 9 wherein said step c3b) comprises the steps of:

c3b1) calculating a first estimate for said transistor current for one of said power network transistors in said stage using said ratio and said average current of said stage;

c3b2) adding to said slack current for said stage an amount by which said first estimate for said transistor current exceeds said maximum drain-to-source current of said power network transistor, provided that said first estimate for said transistor current is larger than said maximum drain-to-source current of said power network transistor; and c3b3) assigning a second estimate for said transistor current to said power network transistor, wherein said second estimate for said transistor current is a smaller one of said first estimate for said transistor current and said maximum drain-to-source current of said power network transistor;

wherein said steps c3b1), c3b2) and c3b3) are repeated until said second estimate for said transistor current has been assigned to each of said power network transistors in said stage.

11. The method as recited in claim 9 wherein said step c3c) comprises the steps of:

c3c1) sorting said power network transistors in said stage in descending order of said CDC of said power network transistors;

c3c2) determining a portion of said slack current for said stage attributable to that particular one of said power network transistors which is next according to said sorted order;

c3c3) comparing said portion of said slack current as determined in said step c3c2) with said slack current;

c3c4) incrementing said transistor current of said power network transistor by said portion of said slack current as determined in said step c3c2), provided that said portion of said slack current is smaller than said slack current;

c3c5) incrementing said transistor current of said power network transistor by said slack current, provided that said portion of said slack current is not smaller than said slack current; and c3c6) decrementing said slack current by said increment to said transistor current of said power network transistor;

wherein said steps c3c1) through c3c6) are repeated until said slack current for said stage has been eliminated.

12. The method as recited in claim 1 wherein said potential problems comprise electro-migration and voltage drop violations.

13. The method as recited in claim 1 further comprising the step of:

f) presenting graphically said potential problems of said chip design using a graphical chip viewer.

14. A computer system comprising a processor, an address/data bus coupled to said processor, and a computer-readable memory unit coupled to communicate with said processor, said memory unit containing instructions that when executed implement a method for reliability analysis of a semiconductor chip design, said method comprising the computer implemented steps of:

a) storing device information and node activity data of a circuit within said chip design, wherein said circuit comprises a power network, a plurality of power network transistors and a plurality of signal nodes;

b) partitioning said circuit into a plurality of stages, wherein each of said stages comprises a subset of said power network transistors and a subset of said signal nodes, and wherein a flow of direct current across said stages is absent;

c) estimating a current for each of said power network transistors within each of said stages using said node activity data and said device information;

d) computing node voltages and branch currents of said power network using said currents of said power network transistors; and e) reporting potential problems of said chip design based on said node voltages and said branch currents of said power network.

15. The computer system as recited in claim 14 wherein said stage partitioning is achieved by performing a plurality of depth-first searches (DFS) on said power network transistors, wherein a boundary between two of said stages is established whenever one of VDD, GND, a gate node of a transistor of said circuit and a pad of said circuit is encountered during one of said DFS.

16. The computer system as recited in claim 15 wherein said stage partitioning comprises the steps of:

b1) identifying said power network transistors in said circuit;

b2) creating one of said stages for one of said power network transistors, wherein said one power network transistor is unassigned; and b3) performing said DFS from a source node of said unassigned power network transistor of said step b2);

wherein those of said power network transistors and said signal nodes which are encountered during said DFS of said step b3) are assigned to said stage created in said step b2); and wherein said steps b2) and b3) are repeated until each of said power network transistors has been assigned to one of said stages.

17. The computer system as recited in claim 14 wherein said step c) comprises the steps of:

c1) determining a current driving capacity (CDC) for each of said power network transistors;

c2) computing an average current for each of said stages; and c3) assigning portions of said average current of one of said stages among said power network transistors within said stage using said current driving capacities of said power network transistors, and wherein said step c3) is performed for each of said stages.

18. The computer system as recited in claim 17 wherein said step c1) comprises the steps of:

c1a) identifying a maximum drain-to-source current for one of said power network transistors using said device information;

c1b) determining a toggle count for said gate node of said power network transistor of said step c1a); and c1c) computing said CDC of said power network transistor of said step c1a) using said maximum drain-tosource current and said toggle count for said gate node of said power network transistor;

wherein said steps c1a), c1b) and c1c) are repeated until said CDC of each of said power network transistors has been computed.

19. The computer system as recited in claim 18 wherein said step c1b) comprises the steps of:
- c1b1) looking up a first value for said toggle count for said gate node from said node activity data;
- c1b2) computing a second value for said toggle count for said gate node, provided that said lookup of said first value in said step c1b1) is unsuccessful;
- c1b3) returning said first value as said toggle count for said gate node, provided that said lookup of said first value in said step c1b1) is successful; and
- c1b4) returning said second value as said toggle count for said gate node, provided that said lookup of said first value in said step c1b1) is unsuccessful.

20. The computer system as recited in claim 19 wherein said step c1b2) comprises the steps of:
- identifying that particular one of said stages to which said gate node is assigned;
- identifying all principal inputs of said stage;
- computing a sum by adding up said toggle counts of said principal inputs of said stage; and
- designating said sum as said second value of said toggle count for said gate node.

21. The computer system as recited in claim 17 wherein said step c2) comprises the steps of:
- c2a) computing a charge injected into each of said signal nodes of one of said stages during a simulation period using said device information;
- c2b) computing a total charge injected into said stage during said simulation period by adding up said charges injected into said signal nodes of said stage; and
- c2c) computing said average current for said stage using said total charge injected into said stage and said simulation period;

wherein said steps c2a), c2b) and c2c) are repeated until said average current of each of said stages in said circuit has been computed.

22. The computer system as recited in claim 17 wherein said step c3) comprises the steps of:
- c3a) computing a ratio by adding up said CDC of said power network transistors in one of said stages;
- c3b) computing a transistor current for each of said power network transistors in said stage and a slack current for said stage using said ratio, said maximum drain-to-source currents of said power network transistors and said average current of said stage; and
- c3c) adjusting said transistor currents of said power network transistors in said stage by apportioning said slack current of said stage among said power network transistors based on said CDC of said power network transistors, provided that said slack current for said stage is non-zero;

wherein said steps c3a), c3b) and c3c) are repeated until said transistor current has been assigned, and adjusted when determined to be necessary by said step c3c), for each of said power network transistors in each of said stages in said circuit.

23. The computer system as recited in claim 22 wherein said step c3b) comprises the steps of:
- c3b1) calculating a first estimate for said transistor current for one of said power network transistors in said stage using said ratio and said average current of said stage;
- c3b2) adding to said slack current for said stage an amount by which said first estimate for said transistor current exceeds said maximum drain-to-source current of said power network transistor, provided that said first estimate for said transistor current is larger than said maximum drain-to-source current of said power network transistor; and
- c3b3) assigning a second estimate for said transistor current to said power network transistor, wherein said second estimate for said transistor current is a smaller one of said first estimate for said transistor current and said maximum drain-to-source current of said power network transistor;

wherein said steps c3b1), c3b2) and c3b3) are repeated until said second estimate for said transistor current has been assigned to each of said power network transistors in said stage.

24. The computer system as recited in claim 22 wherein said step c3c) comprises the steps of:
- c3c1) sorting said power network transistors in said stage in descending order of said CDC of said power network transistors;
- c3c2) determining a portion of said slack current for said stage attributable to that particular one of said power network transistors which is next according to said sorted order;
- c3c3) comparing said portion of said slack current as determined in said step c3c2) with said slack current;
- c3c4) incrementing said transistor current of said power network transistor by said portion of said slack current as determined in said step c3c2), provided that said portion of said slack current is smaller than said slack current;
- c3c5) incrementing said transistor current of said power network transistor by said slack current, provided that said portion of said slack current is not smaller than said slack current; and
- c3c6) decrementing said slack current by said increment to said transistor current of said power network transistor;

wherein said steps c3c1) through c3c6) are repeated until said slack current for said stage has been eliminated.

25. The computer system as recited in claim 14 wherein said potential problems comprise electro-migration and voltage drop violations.

26. The computer system as recited in claim 14 further comprising the step of:
- f) presenting graphically said potential problems of said chip design using a graphical chip viewer.

27. In a device for reliability analysis of a semiconductor chip design, a computer-usable medium having computer-readable program code embodied therein for causing a computer to perform the steps of:
- a) storing device information and node activity data of a circuit within said chip design, wherein said circuit comprises a power network, a plurality of power network transistors and a plurality of signal nodes;
- b) partitioning said circuit into a plurality of stages, wherein each of said stages comprises a subset of said power network transistors and a subset of said signal nodes, and wherein a flow of direct current across said stages is absent;
- c) estimating a current for each of said power network transistors within each of said stages using said node activity data and said device information;

d) computing node voltages and branch currents of said power network using said currents of said power network transistors; and e) reporting potential problems of said chip design based on said node voltages and said branch currents of said power network.

28. The computer-usable medium as recited in claim 27 wherein said stage partitioning is achieved by performing a plurality of depth-first searches (DFS) on said power network transistors, wherein a boundary between two of said stages is established whenever one of VDD, GND, a gate node of a transistor of said circuit and a pad of said circuit is encountered during one of said DFS.

29. The computer-usable medium as recited in claim 28 wherein said stage partitioning comprises the steps of:

b1) identifying said power network transistors in said circuit;

b2) creating one of said stages for one of said power network transistors, wherein said one power network transistor is unassigned; and b3) performing said DFS from a source node of said unassigned power network transistor of said step b2);

wherein those of said power network transistors and said signal nodes which are encountered during said DFS of said step b3) are assigned to said stage created in said step b2); and wherein said steps b2) and b3) are repeated until each of said power network transistors has been assigned to one of said stages.

30. The computer-usable medium as recited in claim 27 wherein said step c) comprises the steps of:

c1) determining a current driving capacity (CDC) for each of said power network transistors;

c2) computing an average current for each of said stages; and c3) assigning portions of said average current of one of said stages among said power network transistors within said stage using said current driving capacities of said power network transistors, and wherein said step c3) is performed for each of said stages.

31. The computer-usable medium as recited in claim 30 wherein said step c1) comprises the steps of:

c1a) identifying a maximum drain-to-source current for one of said power network transistors using said device information;

c1b) determining a toggle count for said gate node of said power network transistor of said step c1a); and c1c) computing said CDC of said power network transistor of said step c1a) using said maximum drain-to-source current and said toggle count for said gate node of said power network transistor;

wherein said steps c1a), c1b) and c1c) are repeated until said CDC of each of said power network transistors has been computed.

32. The computer-usable medium as recited in claim 31 wherein said step c1b) comprises the steps of:

c1b1) looking up a first value for said toggle count for said gate node from said node activity data;

c1b2) computing a second value for said toggle count for said gate node, provided that said lookup of said first value in said step c1b1) is unsuccessful;

c1b3) returning said first value as said toggle count for said gate node, provided that said lookup of said first value in said step c1b1) is successful; and c1b4) returning said second value as said toggle count for said gate node, provided that said lookup of said first value in said step c1b1) is unsuccessful.

33. The computer-usable medium as recited in claim 32 wherein said step c1b2) comprises the steps of:

identifying that particular one of said stages to which said gate node is assigned;

identifying all principal inputs of said stage;

computing a sum by adding up said toggle counts of said principal inputs of said stage; and designating said sum as said second value of said toggle count for said gate node.

34. The computer-usable medium as recited in claim 30 wherein said step c2) comprises the steps of:

c2a) computing a charge injected into each of said signal nodes of one of said stages during a simulation period using said device information;

c2b) computing a total charge injected into said stage during said simulation period by adding up said charges injected into said signal nodes of said stage; and c2c) computing said average current for said stage using said total charge injected into said stage and said simulation period;

wherein said steps c2a), c2b) and c2c) are repeated until said average current of each of said stages in said circuit has been computed.

35. The computer-usable medium as recited in claim 30 wherein said step c3) comprises the steps of:

c3a) computing a ratio by adding up said CDC of said power network transistors in one of said stages;

c3b) computing a transistor current for each of said power network transistors in said stage and a slack current for said stage using said ratio, said maximum drain-to-source currents of said power network transistors and said average current of said stage; and c3c) adjusting said transistor currents of said power network transistors in said stage by apportioning said slack current of said stage among said power network transistors based on said CDC of said power network transistors, provided that said slack current for said stage is non-zero;

wherein said steps c3a), c3b) and c3c) are repeated until said transistor current has been assigned, and adjusted when determined to be necessary by said step c3c), for each of said power network transistors in each of said stages in said circuit.

36. The computer-usable medium as recited in claim 35 wherein said step c3b) comprises the steps of:

c3b1) calculating a first estimate for said transistor current for one of said power network transistors in said stage using said ratio and said average current of said stage;

c3b2) adding to said slack current for said stage an amount by which said first estimate for said transistor current exceeds said maximum drain-to-source current of said power network transistor, provided that said first estimate for said transistor current is larger than said maximum drain-to-source current of said power network transistor; and c3b3) assigning a second estimate for said transistor current to said power network transistor, wherein said second estimate for said transistor current is a smaller one of said first estimate for said transistor current and said maximum drain-to-source current of said power network transistor;

wherein said steps c3b1), c3b2) and c3b3) are repeated until said second estimate for said transistor current has been assigned to each of said power network transistors in said stage.

37. The computer-usable medium as recited in claim 35 wherein said step c3c) comprises the steps of:
- c3c1) sorting said power network transistors in said stage in descending order of said CDC of said power network transistors;
- c3c2) determining a portion of said slack current for said stage attributable to that particular one of said power network transistors which is next according to said sorted order;
- c3c3) comparing said portion of said slack current as determined in said step c3c2) with said slack current;
- c3c4) incrementing said transistor current of said power network transistor by said portion of said slack current as determined in said step c3c2), provided that said portion of said slack current is smaller than said slack current;
- c3c5) incrementing said transistor current of said power network transistor by said slack current, provided that said portion of said slack current is not smaller than said slack current; and
- c3c6) decrementing said slack current by said increment to said transistor current of said power network transistor;

wherein said steps c3c1) through c3c6) are repeated until said slack current for said stage has been eliminated.

38. The computer-usable medium as recited in claim 27 wherein said potential problems comprise electro-migration and voltage drop violations.

39. The computer-usable medium as recited in claim 27 further comprising the step of:
- f) presenting graphically said potential problems of said chip design using a graphical chip viewer.

* * * * *